US008741507B1

(12) United States Patent
Huang et al.

(10) Patent No.: US 8,741,507 B1
(45) Date of Patent: Jun. 3, 2014

(54) METHOD FOR SEPARATING PHOTOMASK PATTERN

(71) Applicant: United Microelectronics Corp., Hsin-Chu (TW)

(72) Inventors: Chun-Hsien Huang, Tainan (TW); Ming-Jui Chen, Hsinchu (TW); Chia-Wei Huang, Kaohsiung (TW); Ting-Cheng Tseng, Tainan (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/742,361

(22) Filed: Jan. 16, 2013

(51) Int. Cl.
*G03F 1/70* (2012.01)

(52) U.S. Cl.
USPC .................................. 430/5; 716/53; 716/55

(58) Field of Classification Search
CPC ............... G03F 1/50; G03F 1/70; G03F 1/76
USPC .......................................... 430/5; 716/53, 55
See application file for complete search history.

(56) References Cited

U.S. PATENT DOCUMENTS

| 6,033,811 A | 3/2000 | Lee |
|---|---|---|
| 6,395,438 B1 | 5/2002 | Bruce |
| 6,470,489 B1 | 10/2002 | Chang |
| 6,684,382 B2 | 1/2004 | Liu |
| 6,753,115 B2 | 6/2004 | Zhang |
| 6,763,514 B2 | 7/2004 | Zhang |
| 6,852,453 B2 | 2/2005 | Wu |
| 6,961,920 B2 | 11/2005 | Zach |
| 7,247,887 B2 | 7/2007 | King |
| 7,386,829 B2 | 6/2008 | Lee |
| 7,624,369 B2 | 11/2009 | Graur |
| 7,794,920 B2 | 9/2010 | Choi |
| 7,856,613 B1 | 12/2010 | Weling |
| 2006/0066339 A1 | 3/2006 | Rajski |
| 2006/0085772 A1 | 4/2006 | Zhang |
| 2006/0161452 A1 | 7/2006 | Hess |
| 2007/0020565 A1 | 1/2007 | Koh |
| 2007/0158756 A1 | 7/2007 | Dreeskornfeld |
| 2008/0020326 A1 | 1/2008 | Choi |
| 2008/0069432 A1 | 3/2008 | Hsu |
| 2008/0248429 A1 | 10/2008 | Chou |
| 2009/0193385 A1 | 7/2009 | Yang |
| 2009/0233238 A1 | 9/2009 | Hsu |
| 2009/0258500 A1 | 10/2009 | Yang |
| 2009/0278569 A1 | 11/2009 | Taoka |
| 2009/0300576 A1 | 12/2009 | Huang |
| 2010/0036644 A1 | 2/2010 | Yang |
| 2010/0070944 A1 | 3/2010 | Wu |
| 2010/0086862 A1 | 4/2010 | Yang |
| 2010/0131914 A1 | 5/2010 | Wu |
| 2010/0175041 A1 | 7/2010 | Krasnoperova |
| 2011/0029939 A1 | 2/2011 | Yang |

*Primary Examiner* — Christopher Young

(74) *Attorney, Agent, or Firm* — Winston Hsu; Scott Margo

(57) ABSTRACT

A method for separating photomask pattern, including the following steps: first, a layout pattern is provided, wherein the layout pattern is defined to have at least one critical pattern and at least one non-critical pattern. Then, a first split process is performed to separate the critical pattern into a plurality of first patterns and a plurality of second patterns. A second split process is performed to separate the non-critical pattern into a plurality of third patterns and a plurality of fourth patterns. Finally, the first patterns and the third patterns are output to a first photomask, and the second patterns and the fourth patterns are output to a second photomask.

9 Claims, 6 Drawing Sheets

METHOD FOR SEPARATING PHOTOMASK PATTERN

BACKGROUND OF THE INVENTION

1. Field of the Invention

The present invention generally relates to semiconductor manufacturing process, and more particularly, to a method for separating photomask patterns.

2. Description of the Prior Art

Optical lithography is a crucial step in semiconductor manufacturing. The basic principle of optical lithography is quite similar to that of chemistry-based photography. Images of a patterned photo-mask are projected through high-precision optical systems onto a wafer surface, which is coated with a layer of light-sensitive chemical compound, e.g. photo-resist. The patterns are then formed on the wafer surface after complex chemical reactions and follow-on manufacturing steps, such as development, post-exposure bake, and wet or dry etching.

As the gap between the required feature size and the lithography wavelength gets bigger, the final wafer images are quite different from the original patterns of the mask. In the past few years, resolution enhancement techniques (RETs) have become necessary in order to achieve the required pattern density. One well-known RET is the optical proximity correction (OPC), in which the mask patterns are intentionally "distorted" so that the desired image can be formed on the wafer. Nowadays, considerable amount of computing power has to be dedicated to these kinds of post-layout processes.

In addition to the above-mentioned OPC technology, a process of double patterning has been developed as a cost-effective way to further scale into the deep submicron domain, using the same lithographic technology. One popular form of double patterning is the double exposure lithography, wherein a given layout is split or decomposed into two sets of patterns, each of which is printed using a separate mask in a separate exposure step. The desired layout may be constructed by these two separate patterns.

The greatest advantage of the double exposure lithography is that we can use available photo-lithography technology and tools to manufacture finer patterns with even higher density. However, there are still many process issues to overcome in practice. It is still necessary to improve the conventional pattern split method for double exposure process.

SUMMARY OF THE INVENTION

One issue of the double exposure process is that the step of split that decomposes the layout pattern into two group patterns is mainly carried out by a computer program; and a problem of uneven distribution of the two group patterns tends to occur easily, thereby influencing the quality of the double exposure process.

To solve the issue mentioned above, the present invention provides a method for separating photomask pattern, including the following steps: first, a layout pattern is provided, wherein the layout pattern is defined with at least one critical pattern and at least one non-critical pattern. Then, a first split process is performed to separate or decompose the critical pattern into a plurality of first patterns and a plurality of second patterns. A second split process is performed to separate or decompose the non-critical pattern into a plurality of third patterns and a plurality of fourth patterns. Finally, the first patterns and the third patterns are output to a first photomask, and the second patterns and the fourth patterns are output to a second photomask.

The difference between the present and the conventional split process is that the present invention further comprises a second split process to decompose the non-critical pattern, which is usually decomposed by the computer program in conventional processes. Thanks to the second split, both the critical pattern and the non-critical pattern can split into two photomasks evenly, thereby improving the quality of the exposure process.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
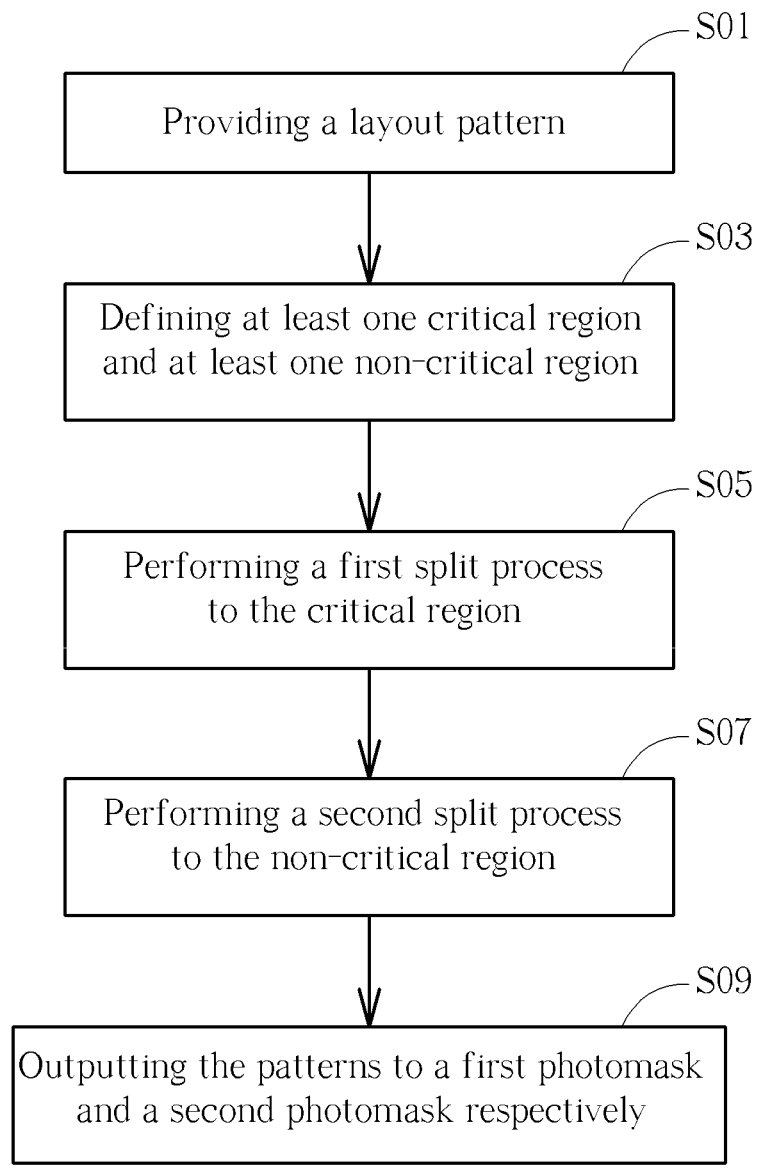
FIG. 1 illustrates the flow chart of a method for splitting photomask pattern according to the first preferred embodiment of the present invention.
Figure 2:
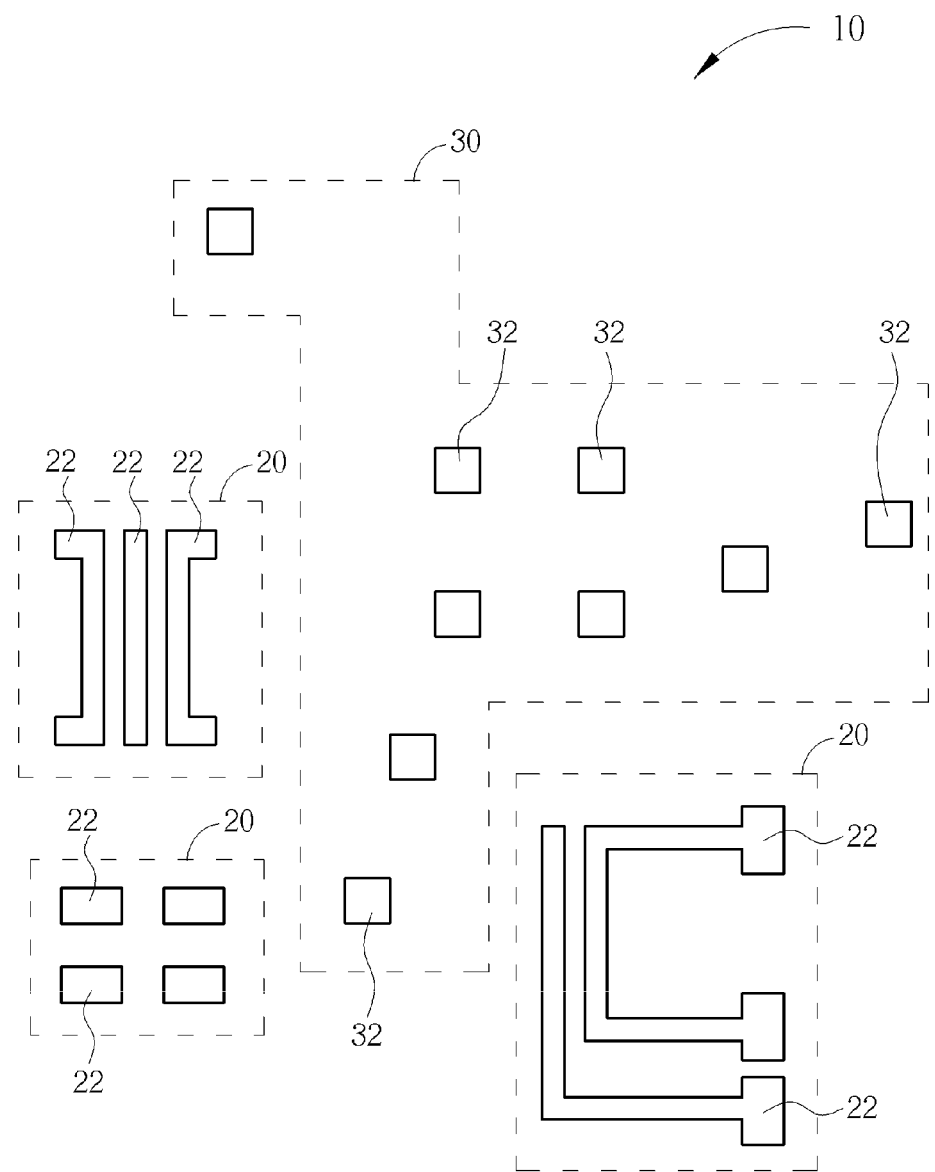
FIGS. 2-6 are schematic, top-view diagrams showing a method for splitting photomask pattern according to the first preferred embodiment of the present invention.

Please refer to FIGS. 1~6. FIG. 1 illustrates the flow chart of a method for splitting photomask pattern according to the first preferred embodiment of the present invention. FIGS. 2-6 are schematic, top-view diagrams showing a method for splitting photomask pattern according to the first preferred embodiment of the present invention. As shown in FIG. 1~2, a layout pattern 10 is first inputted to a computer system or any calculator (step S01) to analyze the whole layout pattern 10. Then, the layout pattern 10 is defined to have at least one critical region 20 and at least one non-critical region 30 (step S03), wherein both the critical region 20 and the non critical region 30 comprise a plurality of sub patterns, and the distance between a sub pattern and an adjacent sub pattern within the critical region 20 is smaller than a critical dimension (CD), but the distance between a sub pattern and an adjacent sub pattern within the non critical region 30 is larger than the critical dimension. In this case, when the distance between a sub pattern and the adjacent sub pattern is smaller than a critical dimension (CD), both the sub pattern and the adjacent sub pattern are defined as a critical pattern 22, and the group of the critical patterns 22 is the critical region 20. On the contrary, when the distance between a sub pattern and the adjacent sub pattern is larger than a critical dimension (CD), both the sub pattern and the adjacent sub pattern are defined as a non-critical pattern 32, and the group of the non-critical patterns 32 is the non-critical region 30. Therefore, each critical region 20 comprises a plurality of critical pattern 22, and each non-critical region 30 comprises a plurality of non-critical pattern 32. The distance between each critical pattern 22 to each adjacent critical pattern 22 is smaller than the critical dimension, and the distance between each one non-critical pattern 32 to adjacent non-critical pattern 32 is larger than the critical dimension. The critical dimension mentioned above generally is the minimum distance between two patterns that makes these two patterns still distinguishable in manufacturing processes, after the exposure process is performed. For example, in 20 nm (nanometer) manufacturing process, the critical dimension is about 118 nm, so when the distance between two patterns is smaller than 118 nm after the exposure process is performed in a 20 nm manufacturing process, these two patterns may be connected together. Therefore, the pattern density is too high to perform exposure processes successfully, thereby influencing the quality of the final semiconductor device.

Figure 3:
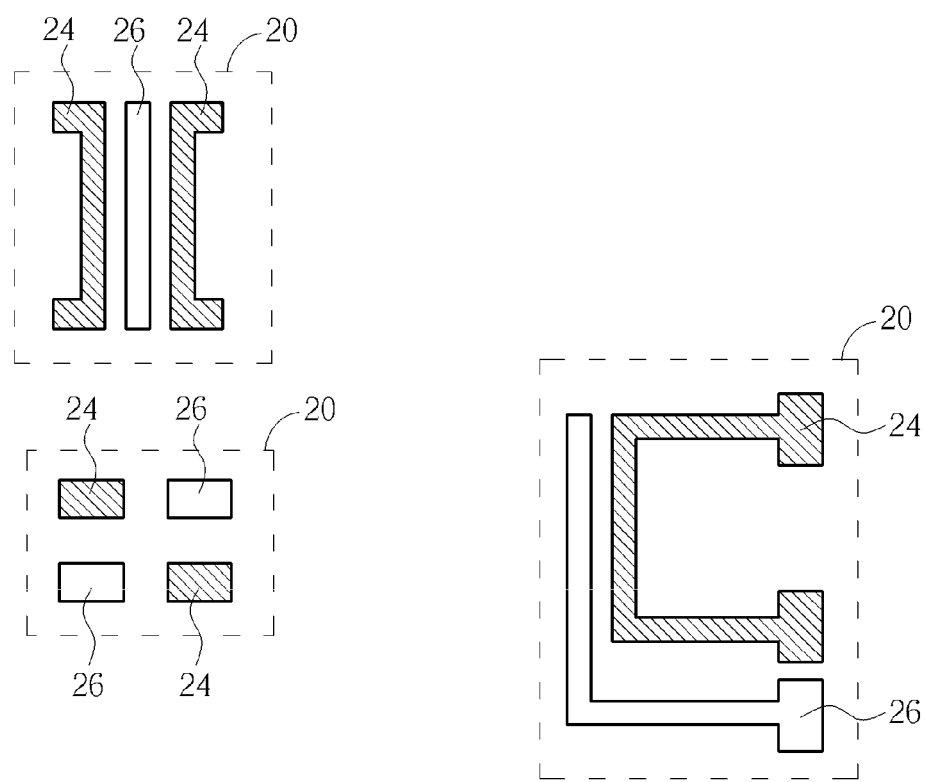

To solve the above mentioned issue, the present invention further comprises performing a first split process to split or decompose the critical patterns 22 within the critical region 20 into two groups (step S05). As shown in FIG. 3, a plurality of first patterns 24 and a plurality of second patterns 26 are defined, wherein all of the first patterns 24 (labeled as slashes) are predicted to be split to a photomask in the following steps, and all of the second patterns 26 are predicted to be split to another photomask in the following steps. The distance between each first pattern 24 to any adjacent first patterns 24 is larger than the critical dimension, and the distance between each second pattern 26 to adjacent second patterns 26 is larger than the critical dimension too. Therefore, the issue of the poor exposure caused by the too small distance between two patterns will not occur anymore.

It is worth noting that the split pattern shown in FIG. 3 is just one possible embodiment; the first split process is not limited thereto. In the scope of the present invention, it may be modified in accordance with the actual requirements, it only needs to satisfy the condition that the distance between each first pattern 24 to adjacent first patterns 24 is larger than the critical dimension, and the distance between each second pattern 26 to adjacent second patterns 26 is larger than the critical dimension.

Figure 4:
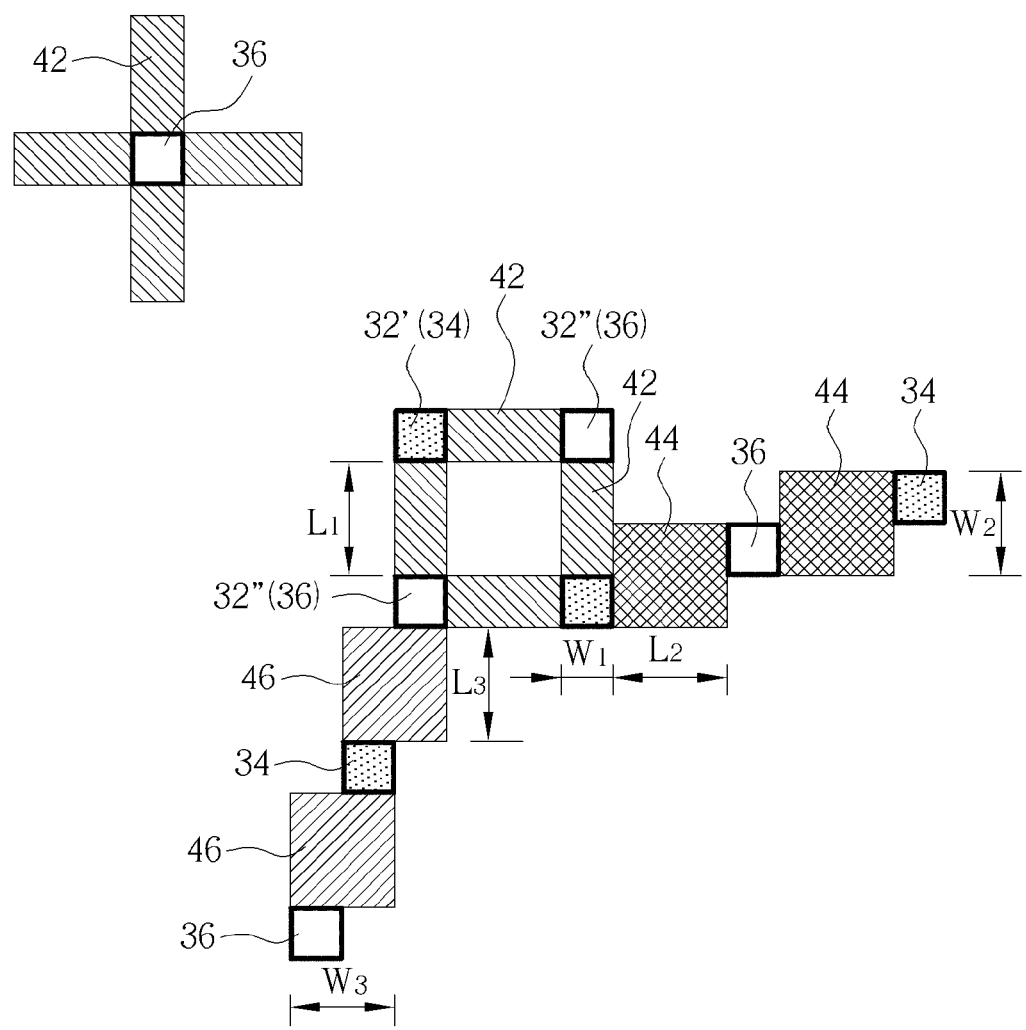

In addition to the first split process, the present invention further comprises a second split process to split or decompose the non-critical patterns 32 within the non-critical region (step S07). The method for splitting the non-critical patterns 32 is described below. As shown in FIG. 4, a non-critical pattern is first chosen within the non-critical region 30 (for example, the non-critical pattern 32' shown in FIG. 4), and a plurality of separator marks is set to be disposed along the edge of the selected non-critical pattern 32', for example, extending outwardly from one edge of the selected non-critical pattern 32'. When a separator mark is touching or contacting the adjacent non-critical pattern (for example, the non-critical pattern 32" shown in FIG. 4), the non-critical pattern 32' is defined as a third pattern 34, and the non-critical pattern 32" is defined as a fourth pattern 36. Then, the touched non-critical pattern 32" is chosen and the process is repeated again, thereby defining the touched non-critical pattern as a third pattern 34 or a fourth patterns 36. The non-critical patterns should be defined as third patterns 34 or fourth patterns 36, depending on the selected non-critical pattern. For example, when one selected non-critical pattern is already defined as a third pattern 34, then the other adjacent non-critical pattern which is touched by the separator mark needs to be defined as a fourth patterns 36. On the contrary, when one selected non-critical pattern is already defined as a fourth pattern 36, the other adjacent non-critical pattern which is touched by the separator mark needs to be defined as a third patterns 34. The process is repeated until all of the non-critical patterns 32 within the non-critical region 30 are defined. Since parts of the non-critical patterns are disposed far form other non-critical patterns, the separator mark will not touch any adjacent non-critical patterns (for example, the non-critical patterns 32 disposed on the upper left corner shown in FIG. 4), so the non-critical patterns 32 can be arbitrarily defined as third patterns 34 or fourth patterns 36. It should be noted that the split pattern shown in FIG. 4 is just one possible embodiment, and the present invention is not limited thereto. In addition, the preferred extending direction is parallel to any edge of the non-critical pattern 32', such as the horizontal or the vertical direction.

Besides, the separator mark may comprise different geometry shapes. FIG. 4 illustrates three different separator marks, labeled as a plurality of first separator marks 42, a plurality of second separator marks 44 and a plurality of third separator marks 46, wherein the first separator mark 42 is rectangular shaped, its width (labeled as W1) is equal to the edge of the non-critical pattern 32 and when a non-critical pattern 32 is arranged parallel to the adjacent non-critical pattern 32 in a horizontal or vertical direction, the first separator mark 42 may contact the adjacent non-critical pattern. When a non-critical pattern is staggered with the adjacent non-critical pattern in a horizontal or vertical direction, the present invention can use the second separator mark 44 or the third separator mark 46, wherein the second separator mark 44 is extending outwardly from the edge of the non-critical pattern in a horizontal direction, and the width of the second separator mark 44 (labeled as W2) is larger than the edge of the non-critical pattern. The third separator mark 46 is extending outwardly from the edge of the non-critical pattern in a vertical direction, and the width of the third separator mark 46 (labeled as W3) is larger than the edge of the non-critical pattern, hence the second separator mark 44 and the third separator mark 46 can contact the obliquely adjacent non-critical pattern. In addition, the length of each separator mark is smaller than a pre-determined distance, wherein by adjusting the pre-determined distance may adjust the split situation of the non-critical pattern 32. For example, in the present embodiment, the length of each separator mark (labeled as L1, L2, L3) is preferred to be smaller than a pre-determined distance, such as 2 micro-meter (2 μm), thereby guaranteeing the distance between one third pattern 34 to another third pattern 34 to be larger than 2 μm, as well as for the fourth pattern 36, guaranteeing the distance between one fourth pattern 36 to another fourth pattern 36 to be larger than 2 μm too. Of course, the present invention is not limited thereto, the length, the width and the shapes of the separator may be adjusted in accordance with the actual requirements, apart from the rectangular shaped, other shapes maybe selected such as circles, ellipses, diamond shapes or others irregular shapes.

It is worth noting that in the process mentioned above, the first split process S05 is performed before the second split process S07. In other words, the critical pattern 22 is split within the critical region 20, and then the non-critical pattern 32 is split within the non-critical region 30. But the present invention is not limited thereto. The present invention also comprises performing the second split process S07 before the first split process is performed. In other words, the non-critical pattern 32 is split within the non-critical region 30, and then the critical pattern 22 is split within the critical region 20. Afterwards, a suitable optical proximity correction (OPC) can be selectively performed to the first pattern, the second pattern, the third pattern and the fourth pattern.

Figure 5:
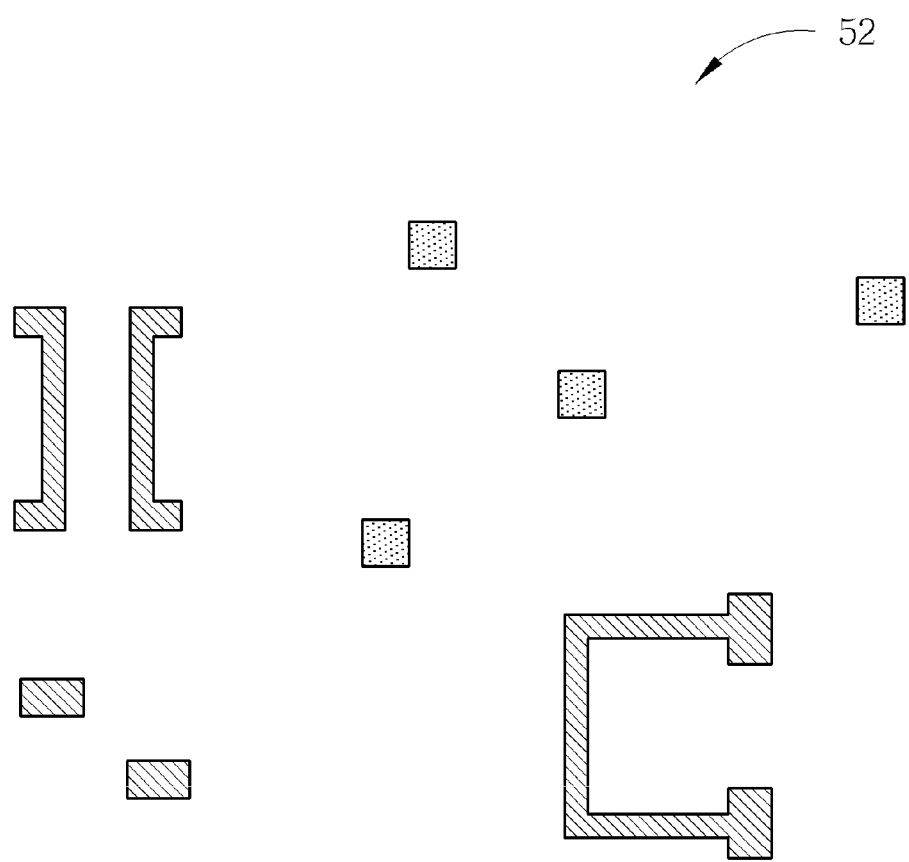
Figure 6:
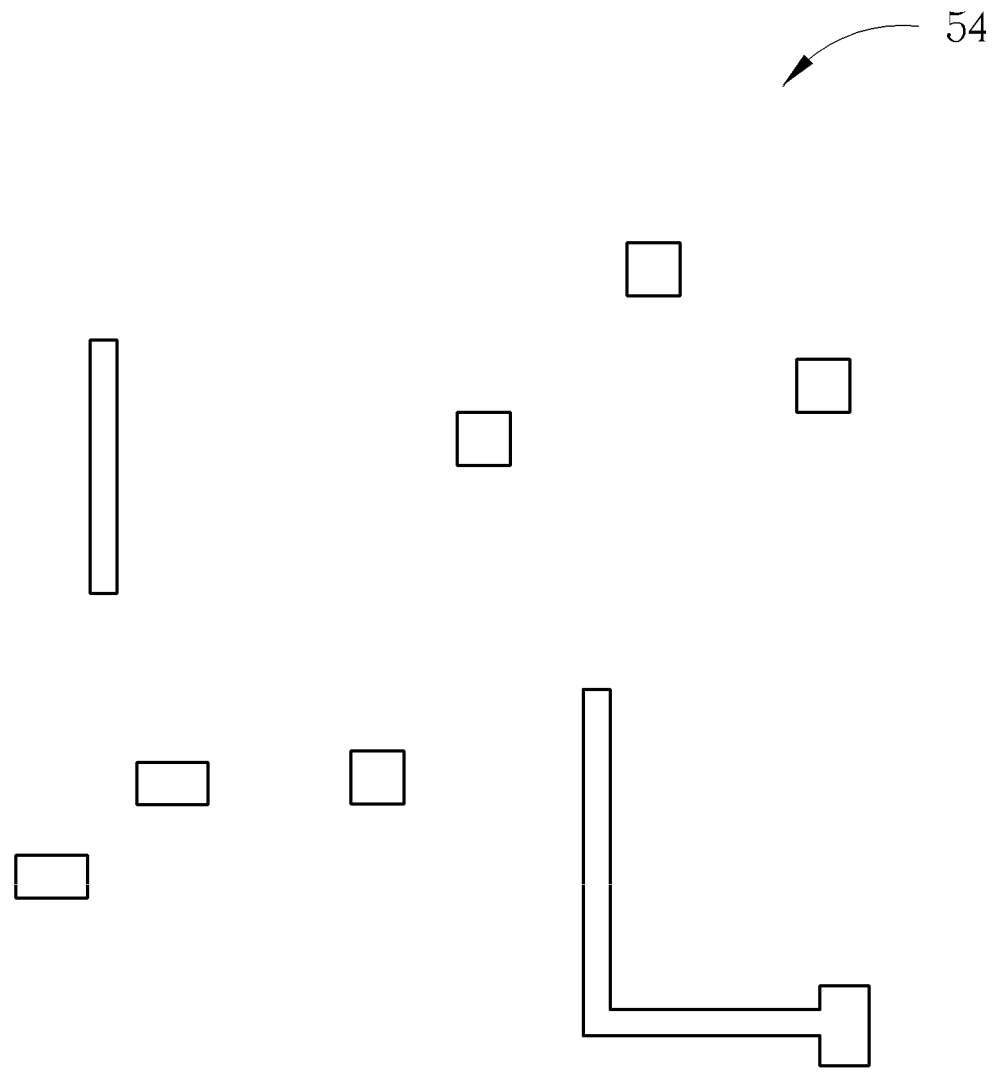

Finally, all the first patterns and all the third patterns included in the layout pattern 10 are outputted to a first photomask, and all the second patterns and all the fourth patterns are outputted to a second photomask (step S09). As shown in FIG. 5-6, the first photomask 52 comprises the first patterns 24 and the third patterns 34; the second photomask 54 comprises the second patterns 26 and the fourth patterns 36. Besides, the method of the present invention may further comprise the outputting all the first patterns and all the fourth patterns included in the layout pattern 10 to a first photomask, and outputting all the second patterns and all the third patterns to a second photomask, at the only condition that the first pattern and the second pattern (or the third pattern and the fourth pattern) are not present on a same photomask simultaneously. Then, two exposure processes are performed sequentially using two photomasks respectively, and the combination of the patterns on the two photomasks corresponds to the layout pattern 10.

The feature of the present invention is that the first split process S05 split the critical pattern to solve the issue of the distance between two patterns being too small for a common process. In addition to the first split process S05, the present invention further comprises a second split process S07 to split the non-critical pattern evenly into two groups. Therefore, the distribution of the patterns on the two photomask is more even, so that the light intensity passing through two photomasks is similar from one another, thereby improving the stability and the quality of the double exposure process.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for separating photomask pattern, including the following steps:
   providing a layout pattern, wherein the layout pattern is defined with at least one critical region and at least one non-critical region, the critical region comprises a plurality of critical patterns, and the non-critical region comprises a plurality of non-critical patterns, wherein the distance between a critical pattern and any adjacent critical pattern is smaller than a critical dimension (CD), and the distance between a non-critical pattern and any adjacent non-critical pattern is larger than the critical dimension;
   performing a first split process to divide the critical patterns into a plurality of first patterns and a plurality of second patterns;
   performing a second split process to divide the non-critical patterns into a plurality of third patterns and a plurality of fourth patterns; and
   outputting the first patterns and the third patterns to a first photomask, and outputting the second patterns and the fourth patterns to a second photomask.

2. The method of claim 1, wherein the distance between each first pattern to each adjacent first pattern is larger than the critical dimension (CD).

3. The method of claim 1, wherein the distance between each second pattern to each adjacent second pattern is larger than the critical dimension (CD).

4. The method of claim 1, wherein the second split process further comprises defining a plurality of separator marks disposed in the non-critical region between each two of the non-critical patterns, wherein the non-critical patterns disposed on one side of the separator mark are defined as third patterns, and the non-critical patterns disposed on the other side of the separator mark are defined as fourth patterns.

5. The method of claim 4, wherein the distance between two separator marks is smaller than a pre-determined distance.

6. The method of claim 4, wherein each separator mark is disposed on the edge of each non-critical pattern, and is extending along outwardly.

7. The method of claim 4, wherein each separator mark is rectangular shaped, and is parallel to each non-critical pattern.

8. The method of claim 4, wherein each separator mark is rectangular shaped, staggered with each non-critical pattern in the horizontal direction.

9. The method of claim 4, wherein each separator mark is rectangular shaped, staggered with each non-critical pattern in the vertical direction.

* * * * *